United States Statutory Invention Registration [19]

[11] Reg. Number: H40

Buchanan, Jr. et al. [45] Published: Apr. 1, 1986

[54] FIELD SHIELDS FOR SCHOTTKY BARRIER DEVICES

[75] Inventors: William L. Buchanan, Jr., Reading; James E. Kohl, Wyomissing; Robert S. Scott, Spring Township, Berks County, all of Pa.; Yiu-Huen Wong, Berkeley Heights, N.J.

[73] Assignee: AT&T Bell Laboratories

[21] Appl. No.: 632,053

[22] Filed: Jul. 18, 1984

[51] Int. Cl.[4] ..... H01L 29/48; H01L 29/06

[52] U.S. Cl. ..... 357/15; 357/53; 357/20; 357/52

[58] Field of Search ..... 357/15

[56] References Cited

U.S. PATENT DOCUMENTS

| | | | |
|---|---|---|---|
| 3,541,403 | 11/1970 | Lepselter et al. | 317/204 |
| 3,616,380 | 10/1971 | Lepselter et al. | 204/164 |
| 4,119,446 | 10/1978 | Mastroianni | 148/1.5 |
| 4,134,123 | 1/1979 | Shannon | 357/15 |

FOREIGN PATENT DOCUMENTS

| | | | |
|---|---|---|---|
| 5224465 | 2/1977 | Japan | 357/15 M |

OTHER PUBLICATIONS

"Silicon Schottky Barrier Diode. . .", *Bell System Technical Journal,* vol. 47, No. 2, Feb. 1968 , pp. 195–208, Lepselter et al.

"Reverse Current-Voltage Characteristics. . .", *Solid-State Electronics,* vol. 13, pp. 1011–1023, J. M. Andrews et al.

"Optimum Doping Profile. . .", *IEEE Transactions on Electron Devices,* vol. Ed-26, No. 3, Mar. 1979, pp. 243–244, C. Hu.

"Schottky-Barrier Diodes. . .", *Electronic Components and Applications,* vol. 4, No. 4, Aug. 1982, pp. 201–205, Hafemeister.

"High-Voltage Power Schottky. . .", *IBM Technical Disclosure Bulletin,* vol. 25, No. 5, Oct. 1982, pp. 2331–2333, Jambotkar.

"Electric-Field-Shielding Layers. . .", *Electronics Letters,* vol. 19, No. 15, Jul. 21, 1983, pp. 568–570, S. Nakashima et al.

*Primary Examiner*—S. C. Buczinski
*Assistant Examiner*—Linda J. Wallace
*Attorney, Agent, or Firm*—Wendy W. Koba

[57] ABSTRACT

The present invention relates to an improved Schottky barrier device wherein the leakage current present in the reverse bias mode attributed to the presence of an electric field at the Schottky barrier (18) is significantly reduced by the inclusion of one or more field shields (22), P+-type diffusions located under the metal anode (16) of the Schottky barrier device at the Schottky barrier (18). The P+-type field shields, which are disposed in a pattern on the surface of the Schottky barrier, reduce the surface electric field present, thereby significantly reducing the leakage current related thereto.

13 Claims, 8 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FIELD SHIELDS FOR SCHOTTKY BARRIER DEVICES

BACKGROUND OF THE INVENTION

1. Field of the Invention

The present invention relates to the inclusion of field shields in Schottky barrier devices, and more particularly, to the inclusion of one or more field shield diffusions at the metal-semiconductor interface to reduce the surface electric field along the interface, thereby decreasing the reverse bias leakage current of Schottky barrier devices.

2. Description of the Prior Art

Schottky barrier (metal-semiconductor) devices, in particular, diodes, are often used in circuits because they have a low forward voltage drop and a very fast reverse recovery time. These properties make Schottky diodes very useful in applications such as high-speed switching power supply rectifiers. However, compared with conventional p-n junction diodes, Schottky barrier diodes exhibit poor reverse bias characteristics manifested in an increased leakage, particularly at voltages approaching breakdown voltage.

In the past, the reverse characteristics of Schottky barrier diodes were improved by increasing the breakdown voltage of the device, utilizing p-type guard rings diffused into the n-type semiconductor material, as disclosed in U.S. Pat. No. 3,541,403 issued to M. P. Lepselter et al on Nov. 17, 1970. As disclosed, the guard ring is located in the substrate under the insulator-metal interface and functions to reduce the edge breakdown effects existing at the intersection of this interface and the semiconductor surface. The same guard ring structure is discussed in an article entitled "Silicon Schottky Barrier Diode with Near-Ideal I-V Characteristics" by M. P. Lepselter et al appearing in *Bell System Technical Journal,* Vol. 47, No. 2, pp. 195–208.

An improved method for forming guard rings in Schottky barrier diodes is disclosed in U.S. Pat. No. 4,119,446 issued to S. T. Mastroianni on Oct. 10, 1978. Here, the metal-semiconductor structure is formed first and the metal is then used in conjunction with another mask to form a guard ring self-aligned with the periphery of the metal.

Although the use of guard rings will improve the reverse characteristics of Schottky barrier diodes by reducing the edge breakdown effects, relatively large leakage current in the reverse blocking mode will still exist, due to the presence of a high surface electric field along the planar metal-semiconductor interface away from the edge of the interface. This leakage current generally increases very rapidly as the reverse potential is increased and may be several orders of magnitude larger than the leakage current of a diffused junction diode when the electric field approaches the silicon avalanche limit.

In order to reduce the Schottky barrier diode reverse leakage current, a Schottky metal (or metal silicide) which has a high barrier potential can be utilized. Although this will improve the reverse characteristics, the high barrier potential results in a higher forward voltage drop and, therefore, greater power dissipation than desired. In an alternative method, the electric field is reduced at the Schottky barrier when the device is under reverse bias, which results in reducing the leakage current. In particular, the electric field is reduced by increasing the resistivity and depth of the N-type silicon cathode (for the case of a metal-N silicon diode). However, this method of decreasing the leakage current will result in an increased series resistance between the anode and the cathode and thus will again result in an increased forward voltage drop. Further, this method is not very desirable in high-voltage integrated circuit technology since the N-type cathode material may also be used as collectors or drains of bipolar or MOS transistors, respectively, and the increased resistivity will adversely affect the characteristics of these devices.

There remains to be solved the problem of eliminating the leakage current present in Schottky barrier devices related to the presence of a surface electric field without unnecessarily increasing the forward voltage drop of the device.

SUMMARY OF THE INVENTION

The above-described problem is addressed by the present invention which relates to the inclusion of field shields in Schottky barrier devices and, more particularly, to the inclusion of one or more field shield diffusions at the metal-semiconductor interface to reduce the surface electric field along the interface, thereby decreasing the reverse bias leakage current of Schottky barrier devices without appreciably increasing the forward bias voltage drop.

It is an aspect of the present invention to diffuse a plurality of closely-spaced P-type regions, referred to as field shields, into an N-type semiconductor substrate (or to diffuse N-type regions into a P-type substrate). The field shields function to modify and thus reduce the surface electric field at the metal-semiconductor interface (Schottky barrier), thereby reducing the reverse leakage current and only moderately increasing the series resistance, without increasing the Schottky barrier height or the cathode material resistivity.

Another aspect of the present invention is to utilize a single P-type diffusion region to reduce the surface electric field, where the single diffusion forms a continuous pattern, for example, a spiral or snake pattern, on the Schottky barrier surface.

Yet another aspect of the present invention is the design of the spacing between the field shields as well as the overall pattern of the diffusions such that the reverse leakage current is reduced.

BRIEF DESCRIPTION OF THE DRAWINGS

Referring now to the drawings.

DETAILED DESCRIPTION

Figure 1:
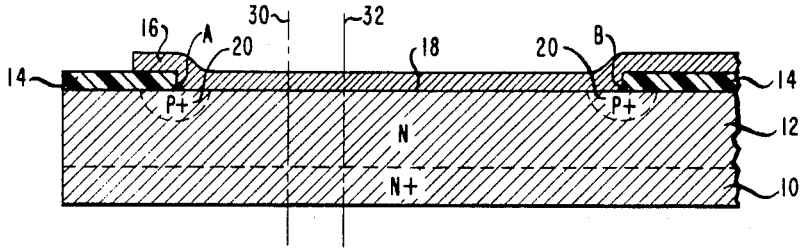
FIG. 1 (PRIOR ART)
FIG. 1 illustrates a cross-sectional view of a prior art Schottky barrier diode, including a guard ring structure which increases the breakdown voltage related to edge breakdown effects.

In order to aid in the understanding of the present invention, the properties of a prior art Schottky barrier diode will be briefly explained with reference to FIG. 1. As shown, an exemplary prior art Schottky barrier diode comprises an $N^+$-type cathode layer 10 upon which is deposited an $N^-$-type substrate region 12. An insulating layer 14 is subsequently deposited on $N^-$ substrate region 12, where a central portion of insulating layer 14 is then etched away, exposing $N^-$ substrate region 12. A metallic layer 16, which forms the anode of the prior art Schottky barrier device, is deposited into the opening created by the etchant and possibly overlaps a portion of insulating layer 14, as illustrated in FIG. 1. Many different metals and alloys may be used as layer 16, where nickel silicide is considered to be one alternative. It is to be understood that a Schottky barrier diode may also be formed with a P-type substrate region and the use of an N-type region throughout the present discussion is considered to be exemplary only.

As is well known, a Schottky barrier diode differs from a conventional diffused p-n junction diode in that Schottky barrier diodes are metal-semiconductor junction devices, where Schottky-barrier 18 is illustrated in FIG. 1. As previously discussed, prior art Schottky barrier diodes attempted to improve the reverse operating characteristics by increasing the reverse breakdown voltage which is related to edge breakdown effects. This was accomplished by the inclusion of an annular guard ring, illustrated in FIG. 1 (in a cross-sectional view) as P-type diffusion 20, where the edges which produce the breakdown effect are indicated at points A and B. As discussed in the above-cited prior art references, guard ring 20 forms a "protection" p-n diode in parallel with the Schottky barrier diode, thus increasing the reverse breakdown voltage of the device. The leakage current related to the electric field along the planar region of Schottky barrier 18 far from guard ring 20, however, is not reduced or eliminated by the inclusion of guard ring 20 in the Schottky barrier diode.

Figure 2:
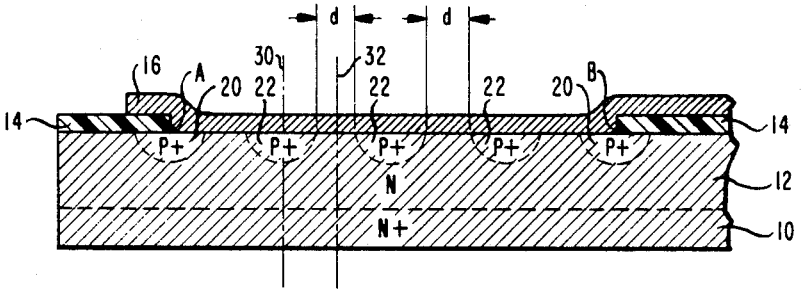
FIG. 2 illustrates a cross-sectional view of a Schottky barrier diode formed in accordance with the present invention which includes a plurality of field shields to reduce the leakage current associated with the surface electric field.

A Schottky barrier diode formed in accordance with the present invention, capable of significantly reducing the surface electric field, which in turn functions to reduce the reverse bias leakage current, is illustrated in FIG. 2. As can be seen, this device differs from the prior art arrangement of FIG. 1 by the addition of a plurality of field shields 22, $P^+$-type diffusions disposed in a predetermined geometric pattern inside guard ring 20, where the individual diffusions are separated from one another by predetermined distances. Although the cross-sectional view of FIG. 2 shows only three field shield diffusions, in the actual practice of the present invention, a large plurality of field shields, for example, hundreds or even thousands, may be diffused into substrate region 12 in the opening created by annular guard ring 20. Alternatively, field shield 22 could be formed using a single $P^+$-type diffusion in the form of a spiral, or any other type of continuous pattern, over the planar surface of Schottky barrier 18.

In accordance with the present invention, the illustrated distance d separating the plurality of field shields 22, for an embodiment utilizing a plurality of field shields, must be small enough such that their respective depletion regions merge together at reverse potentials well below the avalanche breakdown of the Schottky barrier diode in order to significantly reduce the surface electric field. In the case of a single field shield diffusion, the distance separating adjacent portions of the diffusion must also be small enough to allow the depletion region of the adjacent portions to merge in a similar fashion. Further, the deeper the plurality field shields 22 are diffused into $N^-$-type substrate 12, and the closer they are spaced, the larger the two-dimensional field-lowering effect will be.

Figure 3:
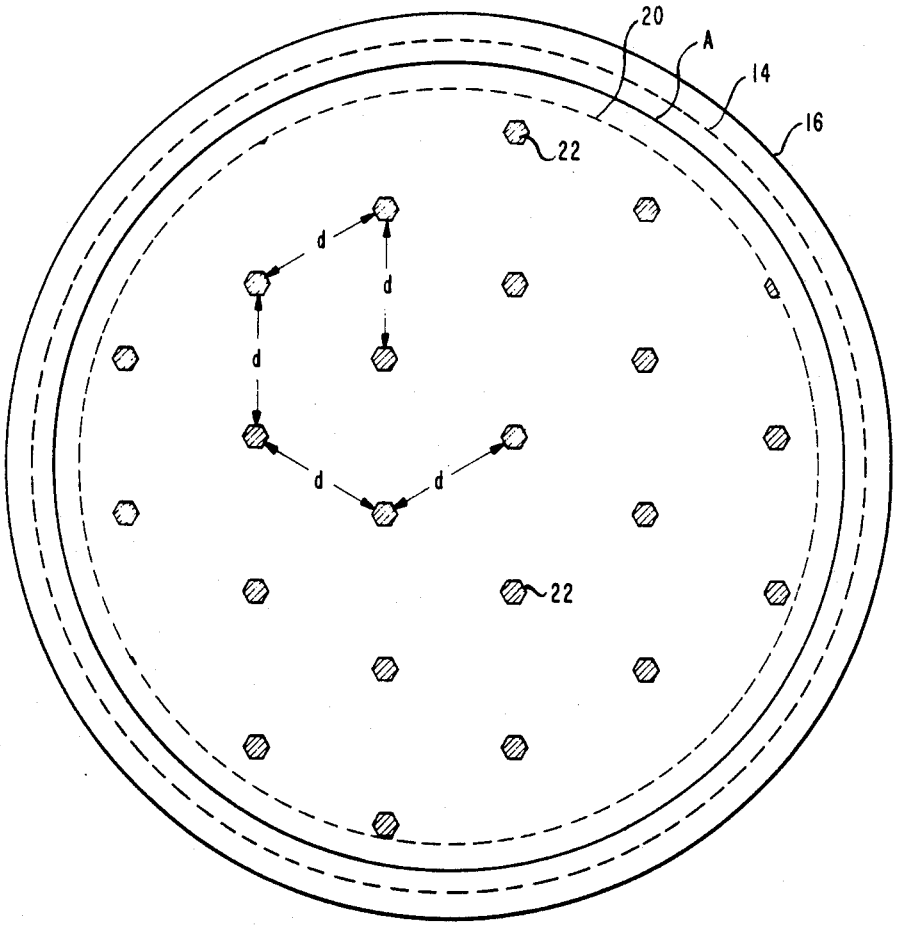
FIG. 3 illustrates a top view of an exemplary Schottky barrier diode formed in accordance with the present invention, where the field shields are distributed in a hexagonal array pattern.
Figure 4:
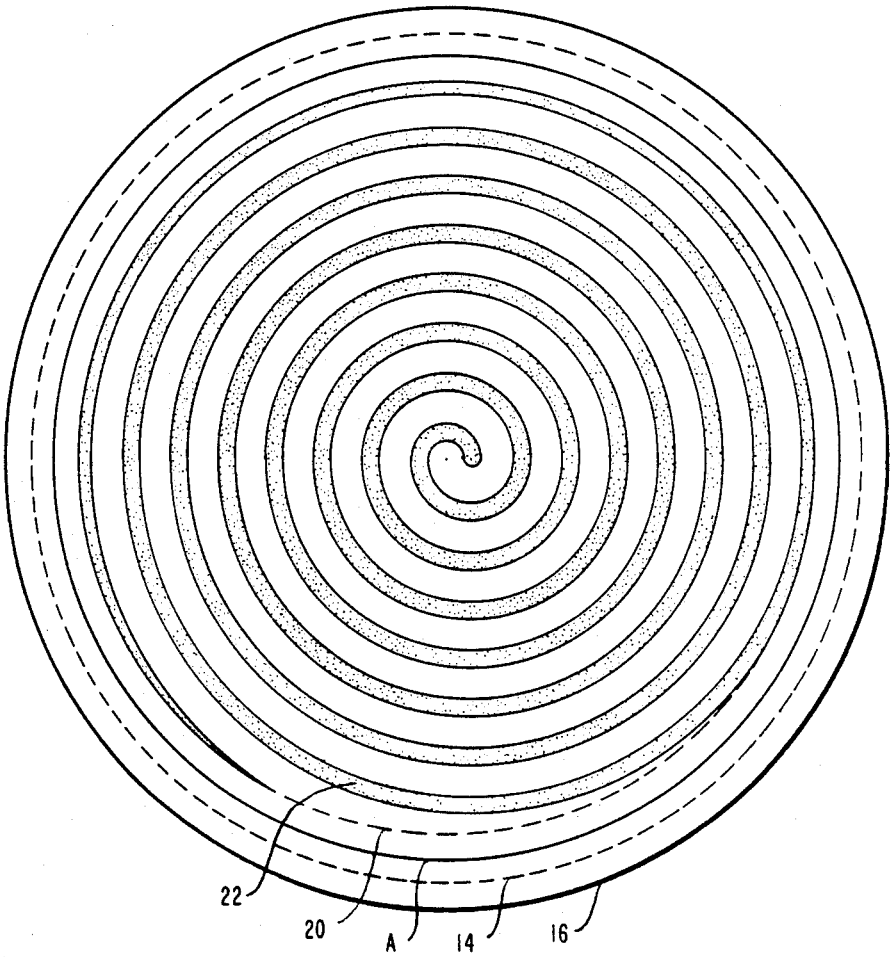
FIG. 4 illustrates a top view of an alternative Schottky barrier diode formed in accordance with the present invention, where the field shield comprises a single diffusion disposed in a spiral pattern.

As stated before, the layout of field shields 22 may comprise one of many different geometrical patterns, where the chosen pattern affects the reduction of the surface electric field along the planar region of Schottky barrier 18 located between field shields 22, thus also affecting the resultant decrease in reverse bias leakage current. One exemplary pattern of field shields 22 is shown in FIG. 3, which illustrates a top view of an exemplary Schottky barrier diode with the plurality of field shields 22 disposed in a hexagonal array arrangement. In the hexagonal arrangement, the distance, d separating adjacent field shield diffusions will be constant. Alternatively, the layout pattern may be a set of concentric rings, where the separation between adjacent rings is designed to provide the desired reduction in reverse bias leakage while not greatly increasing the forward bias voltage drop. A single diffusion, as stated above, may also be utilized to reduce the surface electric field. For example, a continuous snake or spiral diffusion pattern over the surface of Schottky barrier 18 can be used to reduce this surface electric field. FIG. 4 illustrates one exemplary embodiment of the present invention where a spiral diffusion pattern is utilized. Other geometric patterns which may be utilized include a rectangular array, or a set of long, parallel stripes, where these patterns are illustrative only and many other patterns may be utilized in accordance with the present invention to provide sufficient improvement in reducing reverse bias leakage current without seriously degrading the forawrd bias voltage drop.

Figure 6:
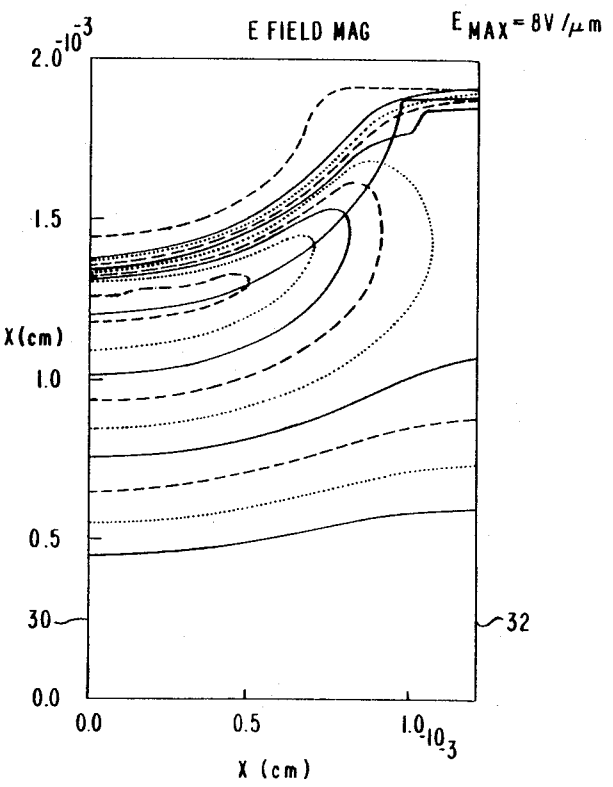
FIGS. 5 and 6 illustrate the calculated electric field contours associated with a prior art Schottky barrier diode (FIG. 5) and a Schottky barrier diode formed in accordance with the present invention (FIG. 6)
Figure 5:
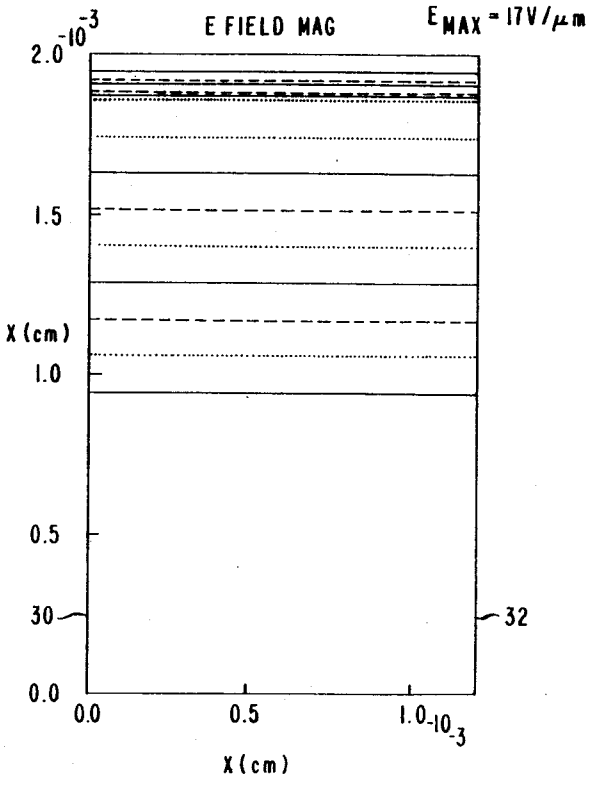
FIG. 5 (PRIOR ART)

Referring now to FIGS. 5 and 6, the effect on the surface electric field related to the inclusion of the plurality of field shields 22 is demonstrated. FIG. 5 illustrates the calculated electric field contours associated with a prior art Schottky barrier diode, as discussed hereinabove in association with FIG. 1, and FIG. 6 illustrates the electric field contours associated with a Schottky barrier diode formed in accordance with the present invention at the same reverse bias potential as associated with FIG. 5. The illustrated electrical field contours correspond to the electric field present in $N^-$ substrate region 12 as measured in the X (width) and Z (depth) directions, between vertical lines 30 and 32 shown in FIGS. 1 and 2. As can be seen, the inclusion of field shields 22 reduces the maximum magnitude of the electric field at Schottky barrier junction 18, thereby reducing the leakage current associated therewith.

Figure 7:
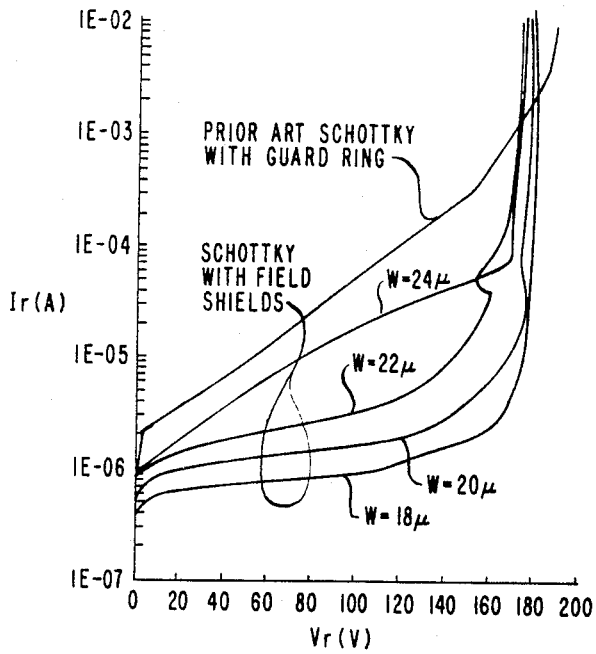
FIG. 7 illustrates the reverse bias current-voltage I-V characteristics for a prior art Schottky barrier diode and a plurality of Schottky barrier diodes formed in accordance with the present invention.

FIG. 7 contains a semi-log graph illustrating the reverse I-V characteristics of both a prior art Schottky barrier diode and a plurality of Schottky barrier diodes formed in accordance with the present invention, illustrated as a function of the spacing, W, between the windows in the diffusion pattern used to create field shields 22. As stated above, and demonstrated in FIG. 7, the closer together the plurality of field shields 22 are spaced, the lower the reverse bias leakage current becomes.

For example, if the reverse bias voltage, $V_r$, applied to the particular conventional prior art Schottky barrier diode used in association with FIG. 7 is, approximately, 140 volts, the reverse bias leakage current, $I_r$, is approximately equal to 0.2 mA. By including a plurality of field shields, in accordance with the present invention, which are diffused using a diffusion window spacing W=24 microns, the reverse bias current $I_r$ decreases from 0.2 mA to approximately 0.04 mA. Using a smaller spacing of W=22 microns current $I_r$ to an approximate value of 9 $\mu$A. As shown in FIG. 7, a further spacing reduction to W=20 microns yields a current $I_r$ of approximately 2.5 $\mu$A and W=18 microns results in $I_r$ approximately equal to 1.5 $\mu$A.

Figure 8:
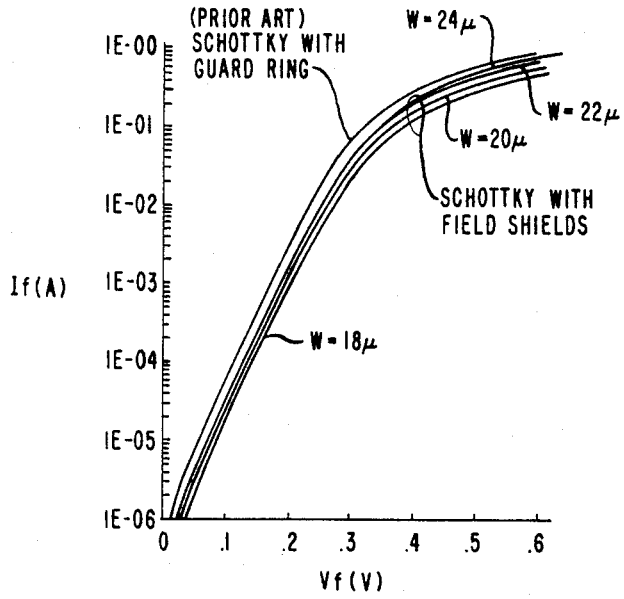
FIG. 8 illustrates the forward I-V characteristics for a prior art Schottky barrier diode and a plurality of Schottky barrier diodes formed in accordance with the present invention.

An advantage of the present invention, as stated above, is that the reverse bias leakage current can be reduced without greatly affecting the forward-bias characteristics of the device. FIG. 8 contains a semi-log current-voltage (I-V) plot of the forward-bias characteristics related to a conventional prior art Schottky barrier diode and a plurality of Schottky barrier diodes formed in accordance with the present invention. Assuming a forward bias current $I_f$ of approximately 100 mA, the conventional Schottky barrier diode will exhibit a forward voltage, $V_f$, of approximately 0.32 volts. Utilizing a Schottky barrier diode formed in accordance with the present invention which uses a diffusion window spacing W=24 microns forward voltage $V_f$ increases only 0.025 volts to approximately 0.345 volts. A spacing of W=22 $\mu$m, as seen by reference to FIG. 8, does not greatly change forward voltage $V_f$. Decreasing the spacing to W=20 $\mu$m results in increasing forward voltage $V_f$ to 0.365 volts, where a further reduction in spacing to W=18 microns increase $V_f$ to approximately 0.385 volts. Thus, as seen by reference to FIG. 8, the use of field shields in accordance with the present invention does not greatly affect the overall I-V curve of the forward biased Schottky barrier diode, but merely increases the forward voltage $V_f$ somewhat over the entire forward voltage range.

What is claimed is:

1. A semiconductor device which comprises a semiconductor layer of a first conductivity type;

an insulating layer disposed on a surface of said semiconductor layer and having an aperture therein exposing a portion of said semiconductor layer;

a metal layer disposed in said aperture and possibly onto a portion of the insulating layer, forming a Schottky barrier with said semiconductor layer therebelow; and a plurality of semiconductor regions of a second conductivity type in physical contact with both said semiconductor layer and said metal layer, each semiconductor region of said plurality of semiconductor regions being separated from one another.

2. A semiconductor device formed in accordance with claim 1 wherein at least one of the plurality of semiconductor regions of the second conductivity type forms an annular guard ring surrounding the remaining semiconductor regions of said plurality of semiconductor regions, said annular guard ring disposed in physical contact with both the metal layer and the insulating layer, completely underlying the edge of the interface between said semiconductor layer and said metal layer.

3. A semiconductor device formed in accordance with claims 1 or 2 wherein the plurality of semiconductor regions of the second conductivity type are arranged in a geometric pattern with the separation between adjacent regions determined by the desired reverse bias leakage current and the desired forward bias voltage drop.

4. A semiconductor device formed in accordance with claim 3 wherein the geometrical pattern is a regular array.

5. A semiconductor device formed in accordance with claim 4 wherein the regular array is a rectangular lattice.

6. A semiconductor device formed in accordance with claim 4 wherein the regular array is a hexagonal lattice.

7. A semiconductor device formed in accordance with claim 4 wherein the regular array is a set of long parallel stripes.

8. A semiconductor device formed in accordance with claim 4 wherein the regular array is a set of concentric rings.

9. A semiconductor device formed in accordance with claims 1 or 2 wherein the plurality of semiconductor regions of the second conductivity type comprises a plurality of diffused regions.

10. A semiconductor device which comprises a semiconductor layer of a first conductivity type;

an insulating layer disposed on a surface of said semiconductor layer and having an aperture therein exposing a portion of said semiconductor layer;

a metal layer disposed in said aperture and possibly onto a portion of the insulating layer, forming a Schottky barrier with said semiconductor layer therebelow; and a semiconductor region of a second conductivity type in physical contact with both said semiconductor layer and said metal layer, said semiconductor region disposed to form a continuous pattern adjoining said Schottky barrier and extending away from the Schottky barrier edge into a central portion of the semiconductor device.

11. A semiconductor device formed in accordance with claim 10 wherein the semiconductor region of the second conductivity type comprises a diffused region.

12. A semiconductor device formed in accordance with claims 1, 2, or 10 wherein the semiconductor layer is silicon and the insulating layer is silicon dioxide.

13. A semiconductor device formed in accordance with claims 1, 2 or 10 wherein the metal layer is nickel silicide.

* * * * *